(12) United States Patent
Fruitman

(10) Patent No.: US 7,083,501 B1
(45) Date of Patent: *Aug. 1, 2006

(54) METHODS AND APPARATUS FOR THE CHEMICAL MECHANICAL PLANARIZATION OF ELECTRONIC DEVICES

(75) Inventor: Clinton O. Fruitman, Chandler, AZ (US)

(73) Assignee: SpeedFam-IPEC Corporation, Chandler, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 09/008,148

(22) Filed: Jan. 16, 1998

Related U.S. Application Data

(63) Continuation of application No. 08/662,678, filed on Jun. 14, 1996, now Pat. No. 5,769,691.

(51) Int. Cl.
    B24B 7/00     (2006.01)

(52) U.S. Cl. .......................... 451/41; 451/285
(58) Field of Classification Search ............ 451/41, 451/285, 287, 288, 59, 60, 526, 530, 533
    See application file for complete search history.

(56) References Cited

U.S. PATENT DOCUMENTS

| 4,048,765 | A | * | 9/1977 | Samuelson | 451/59 |
| 4,057,939 | A | * | 11/1977 | Basi | 451/36 |
| 4,805,348 | A | | 2/1989 | Arai et al. | |
| 5,069,002 | A | | 12/1991 | Sandhu et al. | |
| 5,099,614 | A | | 3/1992 | Arai et al. | |
| 5,329,732 | A | | 7/1994 | Karlsrud et al. | |
| 5,435,772 | A | | 7/1995 | Yu | |
| 5,486,129 | A | | 1/1996 | Sandhu et al. | |
| 5,489,233 | A | | 2/1996 | Cook et al. | |
| 5,498,196 | A | | 3/1996 | Karlsrud et al. | |
| 5,498,199 | A | | 3/1996 | Karlsrud et al. | |
| 5,534,106 | A | | 7/1996 | Cote et al. | |
| 5,536,202 | A | | 7/1996 | Appel et al. | |
| 5,752,875 | A | * | 5/1998 | Ronay | 451/41 |
| 5,769,691 | A | * | 6/1998 | Fruitman | 451/41 |

FOREIGN PATENT DOCUMENTS

| EP | 0439124 | 7/1991 |
| JP | 01071661 | 3/1989 |
| WO | WO 94/04599 | 3/1994 |

OTHER PUBLICATIONS

Bajaj, R. et al., Materials Research Society Symposium Proceedings, vol. 337, Effect of Polish Pad Material Properties on Chemical Mechanical Polishing (CMP) Processes, Apr. 4, 1994, pp. 637–644.

\* cited by examiner

*Primary Examiner*—Eileen P. Morgan
(74) *Attorney, Agent, or Firm*—Snell & Wilmer L.L.P.

(57) ABSTRACT

Method and apparatus for chemically and mechanically planarizing the surface of a silicon wafer which includes a compressible non-cellualar lapping surface and a slurry disposed between the wafer and the lapping surface.

7 Claims, 5 Drawing Sheets

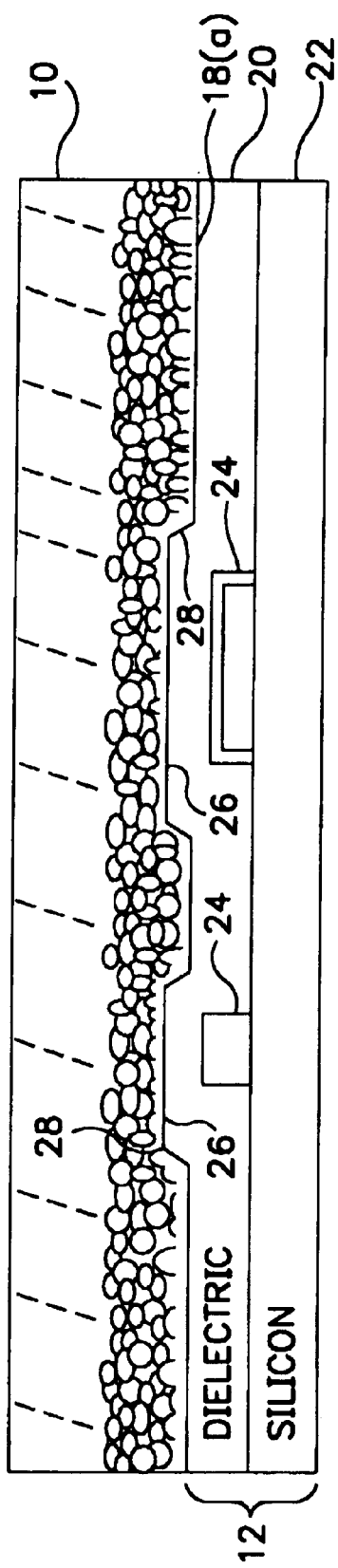
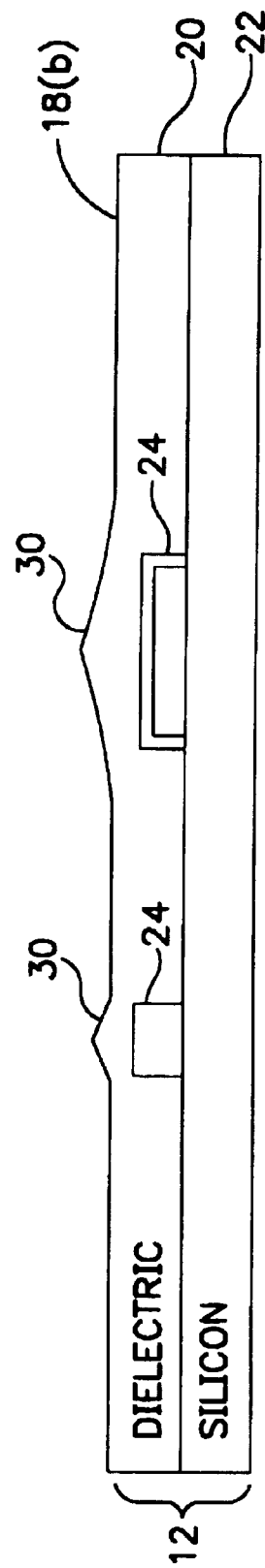
FIG. 4A
FIG. 4B

METHODS AND APPARATUS FOR THE CHEMICAL MECHANICAL PLANARIZATION OF ELECTRONIC DEVICES

This is a continuation of application Ser. No. 08/662,678, filed Jun. 14, 1996. Now U.S. case 5,769,691.

TECHNICAL FIELD

The present invention relates, generally, to methods and apparatus for the planarization and fine finishing of flat surfaces in the microelectronics industry and, more particularly, to the use of a substantially flat, non-cellular pad in a chemical mechanical planarization (CMP) process.

BACKGROUND ART AND TECHNICAL PROBLEMS

Chemical mechanical planarization ("CMP") is widely used in the microelectronics industry. A typical CMP process involves polishing back built up insulating layers of insulators or conductors on integrated circuit chips during manufacture.

More particularly, a resinous polishing pad having a cellular structure is employed in conjunction with a slurry, for example a water-based slurry comprising colloidal silica particles. When pressure is applied between the polishing pad in the workpiece (e.g., silicon wafer) being polished, mechanical stresses are concentrated on the exposed edges of the adjoining cells in the cellular pad. Abrasive particles within the slurry concentrated on these edges tend to create zones of localized high stress at the workpiece in the vicinity of the exposed edges of the polishing pad. This localized pressure creates mechanical strain on the chemical bonds comprising the surface being polished, rendering the chemical bonds more susceptible to chemical attack or corrosion (e.g., stress corrosion). Consequently, microscopic regions are removed from the surface being polished, enhancing planarity of the polished surface. See, for example, Arail et al., U.S. Pat. No. 5,099,614, issued March, 1992; Karlsrud, U.S. Pat. No. 5,498,196, issued March, 1996; Arai, et al., U.S. Pat. No. 4,805,348, issued February, 1989; Karlsrud et al., U.S. Pat. No. 5,329,732, issued July, 1994; and Karlsrud et al, U.S. Pat. No. 5,498,199, issued March, 1996. For a further discussion of presently known lapping and planarization techniques. By this reference, the entire disclosures of the foregoing patents are hereby incorporated herein.

Presently known polishing techniques are unsatisfactory in several regards. For example, as the size of microelectronic structures used in integrated circuits decreases, and further as the number of microelectronic structures on current and future generation integrated circuits increases, the degree of planarity required increases dramatically. For example, the high degree of accuracy of current lithographic techniques or smaller devices requires increasingly flatter surfaces. Presently known polishing techniques are believed to be inadequate to produce the degree of planarity and uniformity across the relatively large surfaces of silicon wafers used in integrated circuits, particularly for future generations.

Presently known polishing techniques are also unsatisfactory in that the cellular structure of the polishing pad tends to generate heat at the interface between the pad and the workpiece. The presence of heat is problematic in that it tends to dry the slurry in the vicinity of large workpiece centers. As a polishing pad moves radially inward across the surface of a circular wafer, it has been observed that the slurry can dehydrate unevenly across the surface of the workpiece. Consequently, the polishing effect of the pad can be non-uniform across the surface of the workpiece, resulting in non-uniform planarization effects.

Chemical mechanical planarization techniques and materials are thus needed which will permit a higher degree of planarization and uniformity of that planarization over the entire surface of integrated circuit structures.

SUMMARY OF THE INVENTION

In accordance with a preferred exemplary embodiment of the present invention, a chemical mechanical planarization process employs a non-cellular surface or pad in lieu of the traditional cellular polishing pad employed in presently known CMP processes. Such a flat or non-cellular pad dramatically reduces the number of stress concentration points over a given surface area of contact between the polishing pad and the workpiece being polished, resulting in a more uniform planarization across the workpiece surface. In accordance with a further aspect of the present invention, the use of a non-cellular pad also may have the effect of reducing the extent to which the pad bends over device topographies due to the lack of a cellular nap. In accordance with a further aspect of the present invention, to the extent the reduction in asperity density (number of stress concentration points per surface area at the polishing pad) reduces the material removal rate in the polishing process, the pressure between the polishing pad and workpiece may be increased to thereby compensate for the reduction removal rate. Inasmuch as the increased pressure will be spread out over a greater surface area of contact between the pad and the workpiece, damage to delicate microstructures may be concomitantly minimized.

In accordance with a further aspect of the present invention, the use of a non-cellular or substantially flat polishing pad effectively performs a lapping function on the workpiece, to the extent contact forces are distributed over a greater area for a given applied pressure, achieving maximum flatness and planarity on the workpieces being polished.

In accordance with a further aspect of the present invention, use of a noncellular and/or substantially flat pad in lieu of the traditional cellular polishing pads facilitates more uniform slurry distribution, reducing non-uniform effects of planarization on the finished workpieces.

BRIEF DESCRIPTION OF THE DRAWING FIGURES

The subject invention will hereinafter be described in conjunction with the appended drawing figures, wherein like numerals designate like elements, and:

FIG. 4(a) is a schematic cross-section view of an exemplary section of an integrated circuit, showing microelectronic structures imbedded in a dielectric layer, shown in conjunction with a presently known polishing pad;

FIG. 4(b) is a schematic representation of the structure of FIG. 4(a) upon completion of a presently known polishing process, illustrating localized non-planarity;

DETAILED DESCRIPTION OF PREFERRED EXEMPLARY EMBODIMENTS

Figure 1:
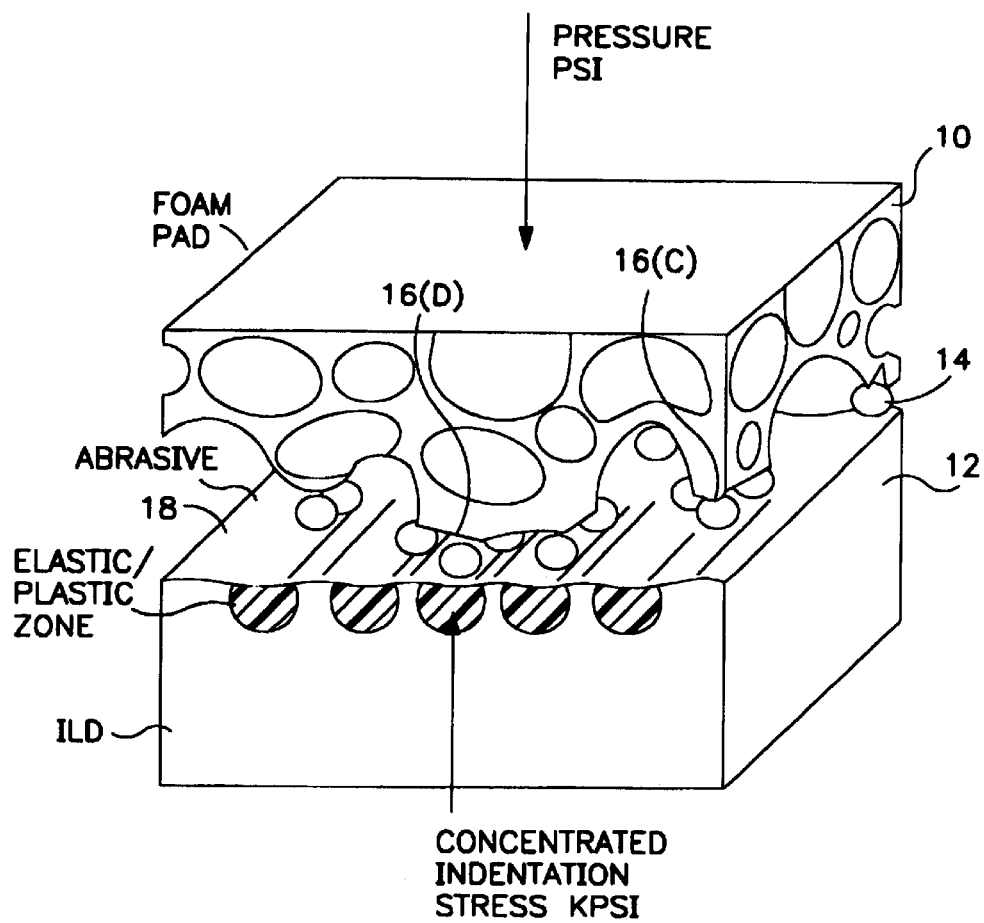
FIG. 1 is a schematic diagram of an exemplary foam polishing pad operating on an exemplary silicon workpiece in an abrasive slurry environment.

Referring now to FIG. 1, presently known CMP processes typically employ a rigid foam polishing pad 10 to polish the surface of a workpiece 12, for example an integrated circuit layer. An abrasive slurry comprising a plurality of abrasive particles 14 in an aqueous medium is employed at the interface between the pad surface and workpiece surface.

Figure 3:
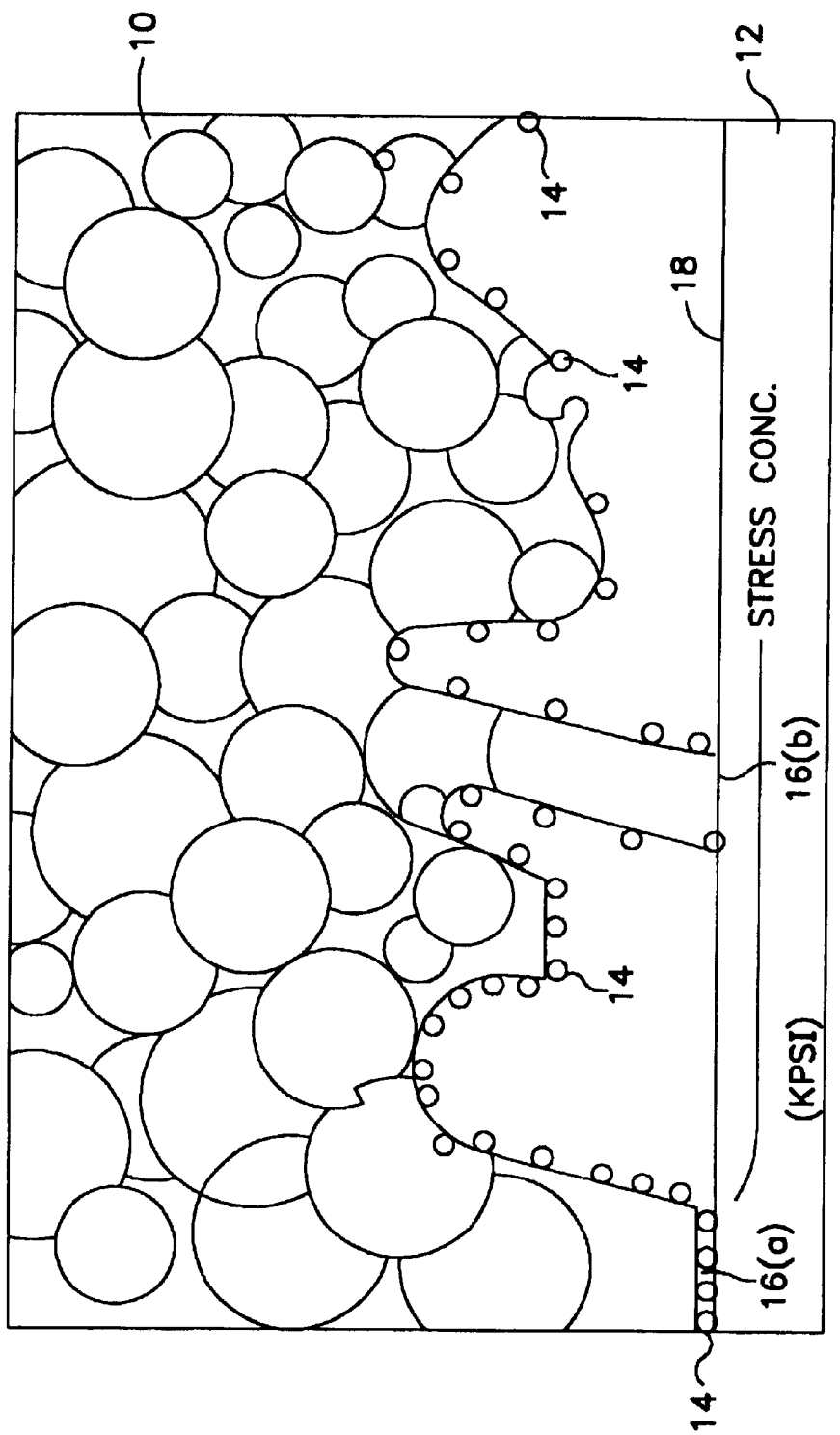
FIG. 3 is a close-up view of an exemplary known polishing pad, showing stress concentration points.

With momentary reference to FIGS. 1 and 3, cellular pad 10 comprises a large number of randomly distributed open cells or bubbles, with exposed, irregularly shaped edges forming the junction between cells. Those edge surfaces 16 which come into contact with surface 18 of workpiece 12 are known as asperities, and support the load applied to pad 10 which results in frictional forces between pad 10 and workpiece 12 as pad 10 is moved laterally (e.g., in a circular planatary manner) with respect to workpiece 12 during the polishing process.

With continued reference to FIGS. 1 and 3, abrasive particles 14 within the slurry are urged onto surface 18 of workpiece 12 by asperities 16, creating high stress concentrations at the contact regions between asperities 16 and surface 18. Thus, FIG. 1 illustrates some of the principle mechanical phenomena associated with known CMP processes.

Figure 2:
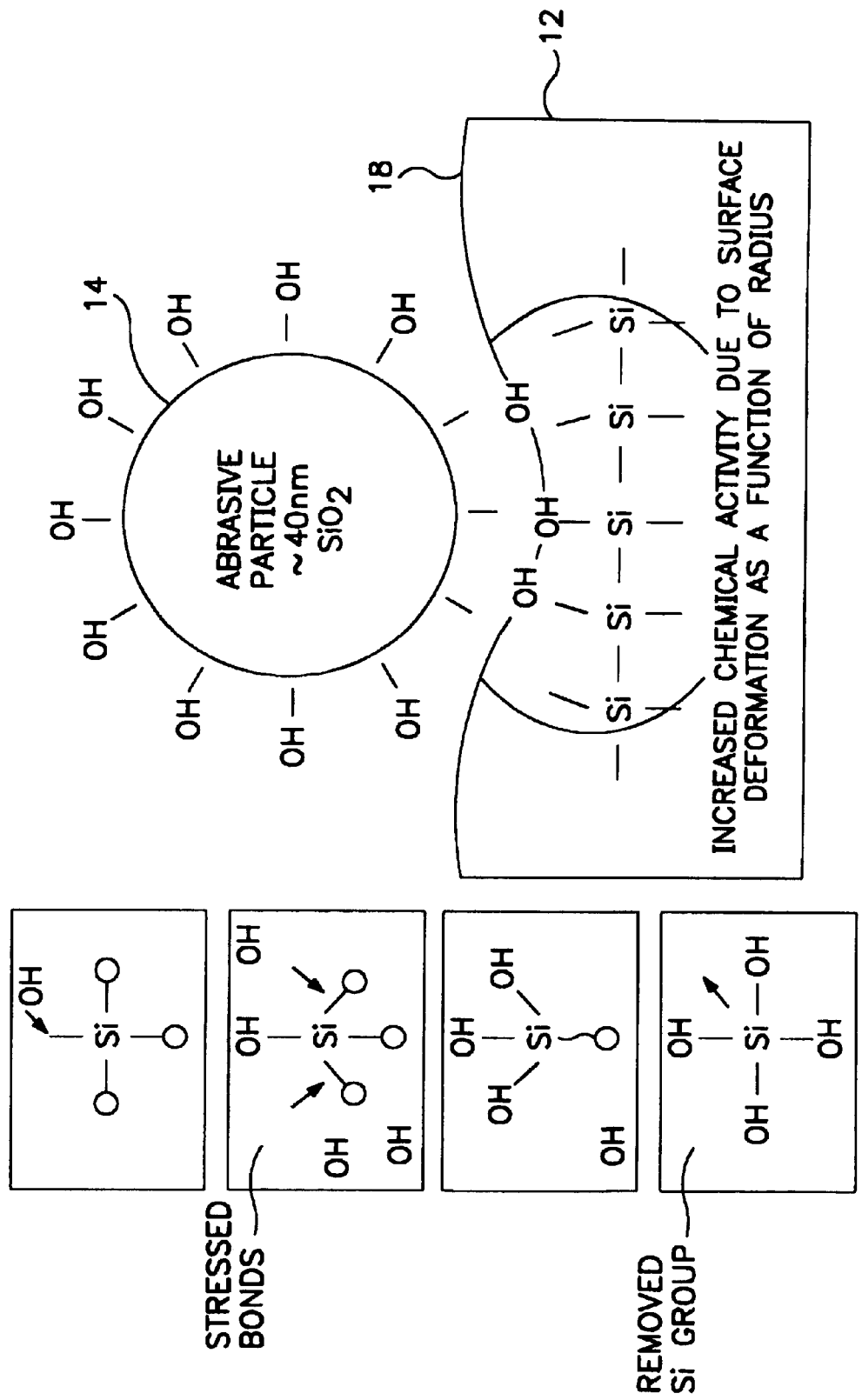
FIG. 2 is a concept diagram illustrating chemical aspects of a traditional chemical mechanical planarization process.

Referring now to FIG. 2, some of the principle chemical phenomena associated with known CMP techniques are illustrated. For example, in the case of polishing silica dialectrics, an ownwardly and impressed onto surface 18 of workpiece 12 by the pad, the chemical bonds which make up the structure of that layer of workpiece 12 in contact with pad 10 become mechanically stressed. The mechanical stress applied to these chemical bonds and their resultant strain increases the affinity of these bonds for hydroxide groups which are attached to abrasive particle 14. When the chemical bonds which comprise surface 18 of workpiece 12 are broken, silanols are liberated from surface 18 and carried away by the slurry. The liberation of these surface compounds facilitates the creation of a smooth, flat, highly planar surface 18.

In the context of a preferred embodiment of the present invention, a slurry is used to effect the chemical/mechanical polishing and planarization effects. More particularly, in the context of the present invention, a "slurry" suitably comprises a chemically and mechanically active solution, for example including abrasive particles coupled with chemically reactive agents. Suitable chemically reactive agents include hydroxides, but may also include highly basic or highly acidic ions: Suitable agents (e.g., hydroxides) are advantageously coupled to the abrasive particles within the slurry solution. In the context of a particularly preferred embodiment, suitable abrasive particles within the slurry may be on the order of 10–200 nanometers in size in the source (dry) state, and most preferably about 30–80 nanometers. This is in contrast to traditional lapping solutions, which may include abrasives having sizes in the range of 0.5–100 micrometers. Suitable slurries in the context of the present invention may also include oxidizing agents (e.g., potassium fluoride), for example in a concentration on the order of 5–20% by weight particle density, and most preferably about 11% by weight particle density.

Referring now to FIGS. 3 and 4(a), an exemplary workpiece 12 suitably comprises a silicon layer 22 having microelectronic structures 24 disposed thereon (or therein). In accordance with the illustrated embodiment, microstructures 24 may comprise conductors, via holes, or the like, in the context of an integrated circuit. Workpiece 12 further comprises a dielectric layer 20 applied to the surface of silicon layer 22, which dielectric layer may function as an insulator between successive silicon layers in a multiple-layered integrated circuit.

During the semi-conductor manufacture process, dielectric 20 is placed over silicon layer 22 (and its associated electronic microstructures) in such a way that localized device topographies (e.g., ridges) 26 are formed in the dielectric layer corresponding to microstructures 24. It is these ridges, inter alia, which need to be eliminated during the CMP process to form an ideally uniform, flat, planar surface upon completion the CMP process. However, as is known in the art, present CMP techniques are not always capable of producing a sufficiently flat, planar surface, particularly for small device lithography, for example in the submicrometer (e.g., less than 2.5 micrometer) range.

Referring now to FIGS. 4(a) and 4(b), the asperities (e.g., projections) associated with the undersurface of polishing pad 10 contact dielectric surface 20 as surface 20 and pad 10 are moved relative to one another during the polishing process. A chemically and mechanically active slurry or other suitable solution (not shown in FIG. 4) is provided between the mating surfaces of workpiece 12 and pad 10 to facilitate the polishing process. As pad 10 moves relative to workpiece 12, the asperities associated with pad 10, in conjunction with the abrasive particles comprising the slurry, polish down device topographies (ridges) 26, removing material from the ridges in accordance with the chemical and mechanical phenomena associated with the CMP process described above. In particular, the irregular edges which form the surfaces adjoining the cells of pad 10 tend to deflect or bend as they encounter respective leading edges 28 of ridges 26, trapping abrasive particles between the asperities associated with pad 10 and the edges of respective device topographies 26 wearing down respective edges 28 at a faster rate than the device topography surfaces. During the course of the polishing process, ridges 26 are typically worn down until they are substantially co-planar with surface 18; however, it is known that this planarization process is incomplete. Hence, residual nodes or undulations 30 typically remain proximate microstructures 24 upon completion of the planarization process. Although surface 18(b) associated with workpiece 12 is certainly more highly planar upon completion of the CMP process than the surface 18(a) associated with workpiece 12 prior to completion of the planarization process, the existence of nodules can nonetheless be problematic, particularly in future generation integrated circuits wherein extremely high degrees of planarity are desired.

Figure 5A:
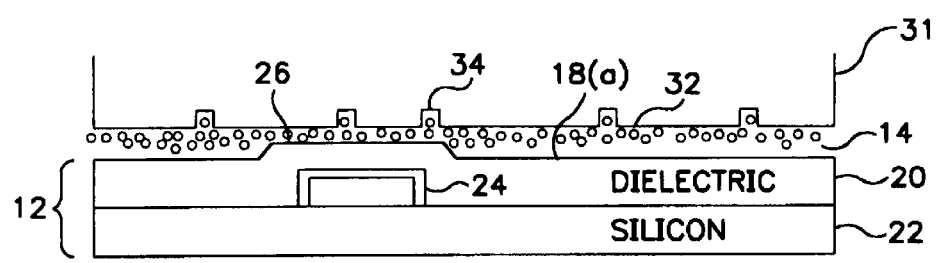
FIG. 5(a) is a schematic cross-section view of a non-cellular pad in accordance with a preferred embodiment of the present invention.
Figure 5B:
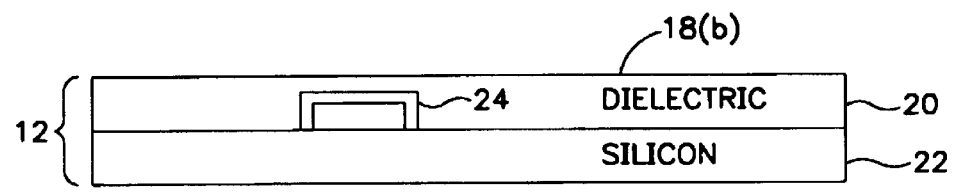
FIG. 5(b) is a schematic cross-section view of the structure of FIG. 5(a) illustrating the enhanced planarity achievable with the substantially flat "lapping" pad of the present invention.

Referring now to FIG. 5, a "lapping" pad 31 is suitably employed in a CMP process in lieu of polishing pad 10. In accordance with a particularly preferred embodiment, pad 31 suitably comprises a substantially flat surface in contact with workpiece 12, characterized by relatively few surface irregularities 34. In particular, surface irregularities 34 may comprise scratches or other non-planarities associated with the dressing of pad 31; alternatively, irregularities 34 may simply result from the welding together of polymers comprising pad 31, e.g., fused polyethylene, non-cellular urethanes, and the like.

In accordance with a further aspect of the present invention, pad 30 is suitably made from a porous material, which permits the adsorption and/or entrainment of suitable slurries, for example, aqueous high pH slurries comprising colloidal silica such as SC1 manufactured by the Cabot Corp. or Deltapol 4101 manufactured by SpeedFam Corporation of Chandler, Ariz., or cerium oxide slurried or low pH alumina slurries. In accordance with yet a further aspect of the present invention, pad 30 may suitably comprise any suitable flat material soft enough to resist damage to fragile integrated circuit device layers, e.g., flexibilized, epoxies. In this regard, it is desirable that pad 30 be desirably relatively pliable to permit the undersurface of pad 31 to conform to the global topography of a workpiece (e.g., wafers) without damaging the delicate microstructures 24 associated with workpiece 12 as pressures are applied between pad 31 and workpiece 12.

With continued reference to FIG. 5, as pad 31 is moved laterally relative to workpiece 12, the downward force of pad 31 and, hence, the lateral shearing forces created at the interface between workpiece 12 and pad 31 are spread out over a substantially larger surface area than was the case with pad 10. Consequently, substantially higher pressures may be applied between workpiece 12 and pad 31 than could be applied between workpiece 12 and pad 10 (see, FIG. 4) without damaging the surface of workpiece 12 (e.g., microstructures 24). Moreover, the flat surface 32 of pad 31, as opposed to the asperities 16 associated w with pad 10, urge particles 14 onto surface 18 more uniformly, thereby resulting in a more uniform planar surface 18(*b*), as shown in FIG. 5(*b*). Indeed, the use of a non-cellular or otherwise substantially flat surface associated with pad 31 greatly reduces the step height of the device microstructures associated with planarized surfaces 18(*b*).

Although the present invention is set forth herein in the context of the appended drawing figures, it should be appreciated that the invention to the specific forms shown. Various other modifications, variations, and enhancements in the design an arrangement of the non-cellular pad and various process parameters discussed herein may be made without departing from the spirit and scope of the present invention as set forth in the appended claims. For example, a preferred embodiment of the present invention is illustrated herein in the context of a dielectric layer over microelectronic structures; however, the present invention may be useful in the context of both multilevel integrated circuits and other small electronic devices, and for fine finishing, flattening and planarization of a broad variety of chemical, electromechanical, electromagnetic, resistive and inductive resistive devices, as well as for the fine finishing, flattening and planarization of optical and electro-optical and mechanical devices. These and other modifications may be made in the design and implementation of various aspects of the invention without departing from the spirit and scope of the invention as set forth in the appended claims.

What is claimed is:

1. An apparatus for chemically and mechanically planarizing a surface of a workpiece comprising:

a non-cellular lapping surface;

workpiece mounting means for mounting said workpiece to expose said workpiece surface to said lapping surface;

an abrasive slurry disposed between said workpiece surface and said lapping surface; and means for relatively moving said lapping surface and said workpiece mounting means such that said workpiece surface is contacted and planarized by said lapping surface.

2. An apparatus as claimed in claim 1, wherein said lapping surface is made from a soft and pliable material that conforms to integrated circuit device layers formed on said workpiece surface and resists damage to said integrated circuit device layers.

3. An apparatus as claimed in claim 2, wherein said lapping surface is made from fused polyethylene, flexibilized epoxy or non-cellular urethane.

4. An apparatus as claimed in claim 1, wherein said abrasive slurry comprises:

about 5–20% by weight of a chemical agent having a particle size of about 10–200 nanometers and being selected from a group consisting of a hydroxide and potassium fluoride; and a mechanical agent selected from a group consisting of colloidal silica, cerium oxide and alumina.

5. An apparatus as claimed in claim 4, wherein said abrasive slurry comprises about 11% by weight of said chemical agent and said particle size is about 30–80 nanometers.

6. A method for chemically and mechanically planarizing a workpiece surface comprising the following steps:

providing a non-cellular lapping surface; and effecting relative movement between said lapping surface and said workpiece surface in the presence of an abrasive slurry to planarize said workpiece surface.

7. A method as claimed in claim 6, and further comprising the step of making said lapping surface from a soft and pliable material that will conform to integrated circuit device layers formed on said workpiece surface and resist damage to said integrated circuit device layers.

\* \* \* \* \*